United States Patent
Chiang et al.

(10) Patent No.: US 10,558,779 B2
(45) Date of Patent: Feb. 11, 2020

(54) METHOD OF REDISTRIBUTION LAYER ROUTING FOR 2.5-DIMENSIONAL INTEGRATED CIRCUIT PACKAGES

(71) Applicant: AnaGlobe Technology, Inc., Hsinchu (TW)

(72) Inventors: Chun-Han Chiang, Taipei (TW); Fu-Yu Chuang, Taipei (TW); Yao-Wen Chang, Taipei (TW); Chih-Che Lin, Hsinchu (TW); Chun-Yi Yang, Hsinchu (TW)

(73) Assignee: AnaGlobe Technology, Inc., Hsinchu (TW)

( * ) Notice: Subject to any disclaimer, the term of this patent is extended or adjusted under 35 U.S.C. 154(b) by 0 days.

(21) Appl. No.: 15/993,606

(22) Filed: May 31, 2018

(65) Prior Publication Data
US 2019/0370433 A1 Dec. 5, 2019

(51) Int. Cl.
*G06F 17/50* (2006.01)

(52) U.S. Cl.
CPC ...... *G06F 17/5077* (2013.01); *G06F 17/5081* (2013.01)

(58) Field of Classification Search
CPC .................. G06F 17/5077; G06F 17/5081
USPC .......................................................... 716/129
See application file for complete search history.

(56) References Cited

U.S. PATENT DOCUMENTS

| | | | |
|---|---|---|---|
| 2009/0032925 A1* | 2/2009 | England | H01L 27/14618 257/680 |
| 2009/0309235 A1* | 12/2009 | Suthiwongsunthorn | H01L 23/3114 257/777 |
| 2015/0179570 A1* | 6/2015 | Marimuthu | H01L 25/0652 257/774 |
| 2018/0032660 A1* | 2/2018 | Lin | G06F 17/5077 |

* cited by examiner

*Primary Examiner* — Suchin Parihar
(74) *Attorney, Agent, or Firm* — Chih Feng Yeh; Huntington IP Consulting Co., Ltd.

(57) ABSTRACT

A method of redistribution layer routing for 2.5D integrated circuit packages is proposed, which is executed by a computer, the method comprising using the computer to perform the following: performing a MMSIM (modulus-based matrix splitting iteration method) based routing to assign pre-assignment nets to tracks such that total vertical distance from each bump pair to the assigned track is minimized; and performing a MWMCBM (minimum weighted maximum cardinality bipartite matching) based routing for bumps connected to the assigned tracks according to matching result to complete redistribution layer routing for integrated circuit packages.

20 Claims, 10 Drawing Sheets

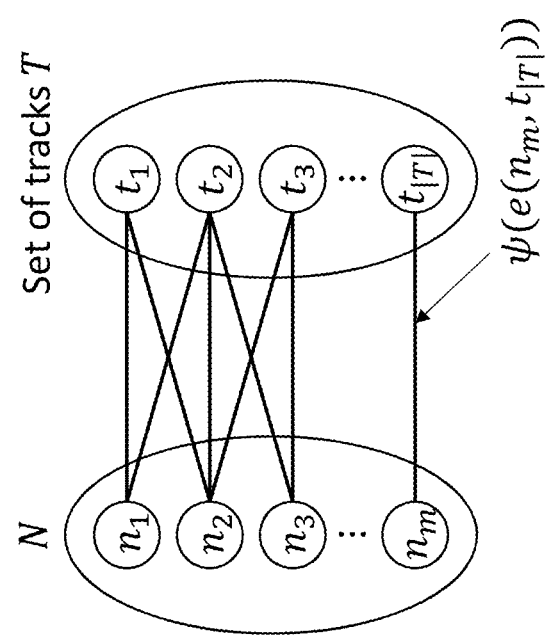

US 10,558,779 B2

METHOD OF REDISTRIBUTION LAYER ROUTING FOR 2.5-DIMENSIONAL INTEGRATED CIRCUIT PACKAGES

TECHNICAL FIELD

The present invention relates to a 2.5-dimensional IC packaging technique, and more particularly, to a method of a unified RDL routing for 2.5-dimensional integrated circuit packages.

BACKGROUND 2.5D IC is a packaging technique for connecting multiple dies to each other or to an external circuitry. A 2.5-dimensional integrated circuit (2.5D IC), which introduces an interposer as an interface between chips and a package, is one of the most popular integration technologies. Multiple chips can be mounted on an interposer, and inter-chip nets are routed on redistribution layers (RDLs). Redistribution layers (RDLs) are used to route nets between dice, dice and package substrate. In traditional designs, the wire widths and spacings are uniform (i.e., grid-based). To improve circuit performance in modern designs, however, variable widths and spacings are also often adopted (i.e., gridless designs).

Recently, 2.5-dimensional integrated circuits (2.5D ICs, also known as interposer-based 3D ICs) have become one of the most popular packaging technologies which support heterogeneous integration and enhance system performance while reducing power consumption and manufacturing complexity. With multiple chips mounted on the interposer, inter-chip nets can be routed on redistribution layers (RDLs) of the interposer by using the same processes as the silicon chips. The integrated chips may come from different vendors, which introduce predefined connections, i.e., pre-assignment nets. Moreover, different from stacked 3D IC packages which employ through-silicon vias (TSVs) to communicate between different layers and the substrate, a 2.5D IC package contains TSVs only in their interposers. Due to the lower fabrication cost and design complexity, many vendors, including ASE, eSilicon, and GlobalFoundries, have adopted 2.5D IC packages as their next-generation solutions for various applications.

In order to improve circuit performance, some optimization techniques, including wire sizing and wire spacing, are proposed to meet the timing and/or power constraints. However, routing complexity increases dramatically due to the variable widths and spacings.

FIG. 1a shows the side view of a 2.5D IC package structure. The main feature of a 2.5D IC package is the interposer 116 which is introduced as an interface between chips 100, 102 and a package (substrate) 122. FIG. 1a shows a general 2.5D IC package, which contains an interposer 116 with inter-chip nets 104 routed on RDLs 112. The through-silicon vias (TSVs) 114 is used to communicate between different layers and the package substrate 122 via frontside bumps 110, frontside RDLs 112, backside RDLs 118 and backside bumps 120. Traditional RDL routing algorithms can be divided into two categories: (1) mathematical programming and (2) graph-based methods. For mathematical programming, Fang et al. proposed an integer linear programming (ILP) based formulation which completes global routing with several reduction techniques to prune redundant solutions (please refer to: J.-W. Fang, C.-H. Hsu, and Y.-W. Chang. An integer-linear-programming based routing algorithm for flip-chip designs. In IEEE TCAD, volume 28, pages 98-110, January 2009). Though this formulation can often obtain the optimal wirelength for global routing, the high time complexity of an ILP makes it prohibitive for solving large-scale designs. For graph-based methods, the previous works adopted network-flow-based methods to deal with RDL routing. Liu et al. exploited the geometrical properties of Voronoi diagrams to model global-routing channels and applied a network flow-based algorithm to solve the routing problem (please refer to: X. Liu, Y. Zhang, G. K. Yeap, C. Chu, J. Sun, and X. Zeng. Global routing and track assignment for flip-chip designs. In Proc. of ACM/IEEE DAC, pages 90-93, June 2010). Based on network-flow-based formulations, flip-chip routing was handled by Fang et al. (please refer to: J.-W. Fang, I.-J. Lin, Y.-W. Chang, and J.-H. Wang. A network-flow-based RDL routing algorithm for flip-chip design. In IEEE TCAD, volume 26, pages 1417-1429, August 2007) and also package-board co-design by Fang et al. (please refer to: J.-W. Fang, M. D. F. Wong, and Y.-W. Chang. Flip-chip routing with unified area-i/o pad assignments for package-board co-design. In Proc. of ACM/IEEE DAC, pages 336-339, July 2009). However, they cannot directly apply to designs with variable wire widths and spacings.

Moreover, a typical structure of the 2.5D IC package, connecting multiple bump pairs on different chips often involves long and parallel inter-chip nets, as shown in FIG. 1b. The long and parallel inter-chip nets may induce severe coupling effects between signals, which degrades signal integrity and circuit performance. In the work of Chen et al. (please refer to: T.-C. Chen, Y.-W. Chang, and S.-C. Lin. A novel framework for multilevel full-chip gridless routing. In Proc. of IEEE/ACM ASP-DAC, pages 636-641, January 2006), a V-shaped multilevel framework was proposed for full-chip gridless routing. This method first partitions a layout into an array of rectangular subregions, and then routes wires of different widths sequentially on those subregions. Without considering routing resources and net ordering, however, it may cause a detour when the routing resource has been occupied by other routed wires.

To better handle the routing problem on RDLs with various constraints, traditional combinatorial routing algorithms might not be sufficient for solving the problem effectively. Therefore, the invention proposes a unified RDL routing framework to resolve the above-mentioned problems.

SUMMARY OF THE INVENTION

In this invention, a method of redistribution layer routing for 2.5D integrated circuit packages is proposed, which is executed by a computer, the method comprising using the computer to perform the following: performing a MMSIM (modulus-based matrix splitting iteration method) based routing to assign pre-assignment nets to tracks such that total vertical distance from each bump pair to the assigned track is minimized; and performing a MWMCBM (minimum weighted maximum cardinality bipartite matching) based routing for bumps connected to the assigned tracks according to matching result to complete redistribution layer routing for integrated circuit packages.

According to one aspect, the method further comprises acquiring a process technology file.

According to another aspect, the process technology file comprises redistribution layer (RDL) layout, pre-assignment netlists, and design rules.

The design rules comprise: each said pre-assignment nets shielded by a power/ground net; spacings of the tracks on adjacent layers larger than minimum spacing between a track and a power/ground net on an identical layer; spacings of the pre-assignment nets on the identical layer larger than the minimum spacing between a track and a power/ground net on the identical layer; and the tracks routed in an interposer region.

According to one aspect, MMSIM based routing includes the following steps: performing a shielding structure alignment, computing target position for track block and shielding block, and performing a net order decision of the pre-assignment nets and layer assignment. The target position for shielding block aligns to a bottom of track block in odd number layer and aligns to a top of track block in even number layer.

According to one aspect, MWMCBM based routing includes a process of distance-aware edge construction and a process of a bipartite matching track assignment.

In the invention, a non-transitory computer-readable medium containing instructions is proposed, which when read and executed by a computer, cause the computer to execute a method of redistribution layer routing for 2.5D integrated circuit packages, wherein the method comprises the above-mentioned steps

BRIEF DESCRIPTION OF THE DRAWINGS

The components, characteristics and advantages of the present invention may be understood by the detailed descriptions of the preferred embodiments outlined in the specification and the drawings attached:

FIG. 3a illustrates a structure of the considered RDL routing plane;

FIG. 3b illustrates a top view of a routing result corresponding to FIG. 3a;

FIG. 5a shows a desired routing structure;

FIG. 5b shows the projection to the column representation of FIG. 5a;

FIG. 8b illustrates a feasible solution after reserving sufficient spacing of FIG. 8a;

FIG. 9 illustrates a bipartite graph construction; and

DETAILED DESCRIPTION

Some preferred embodiments of the present invention will now be described in greater detail. However, it should be recognized that the preferred embodiments of the present invention are provided for illustration rather than limiting the present invention. In addition, the present invention can be practiced in a wide range of other embodiments besides those explicitly described, and the scope of the present invention is not expressly limited except as specified in the accompanying claims.

Figure 1B:
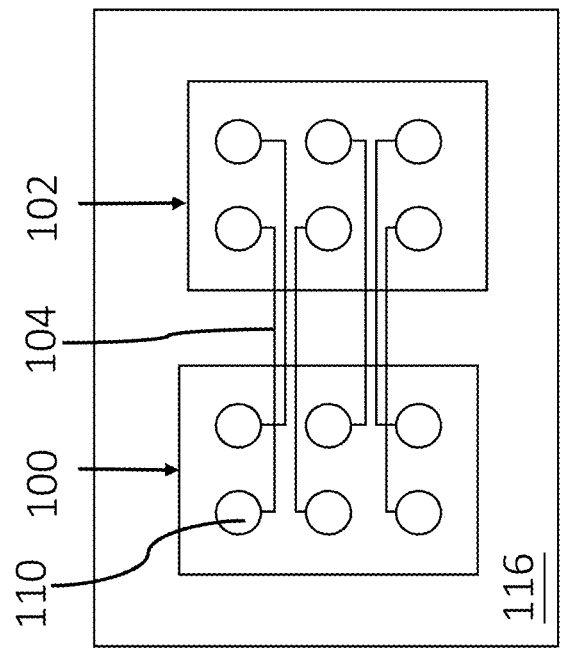
FIG. 1b shows long and parallel inter-chip nets in current 2.5D IC package designs.
Figure 1A:
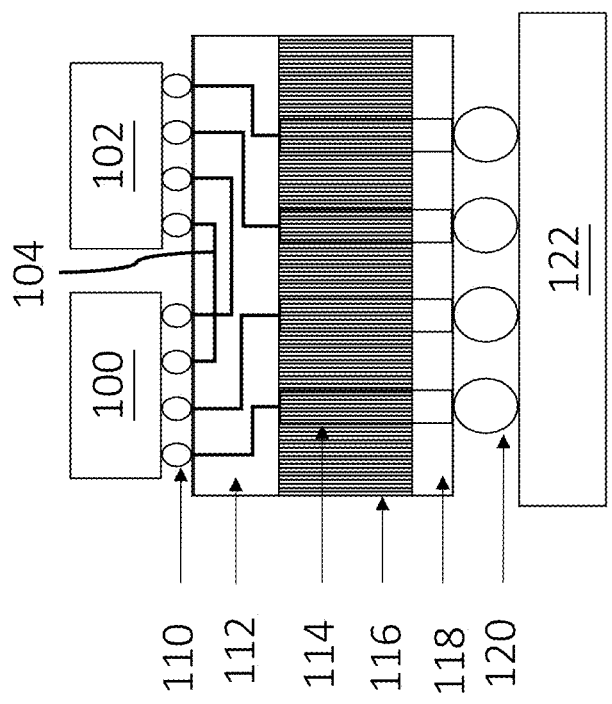
FIG. 1a shows a general 2.5D IC package.
Figure 2:
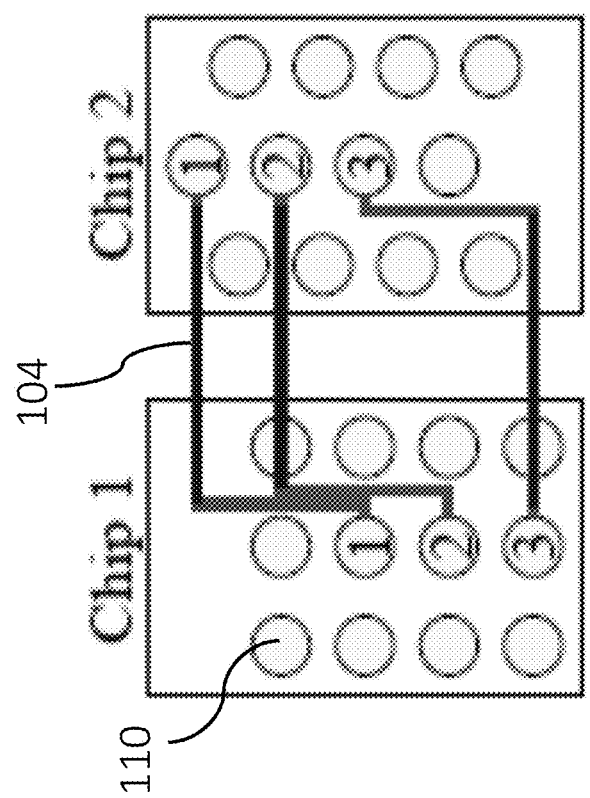
FIG. 2 shows a better routing result from the proposed routing framework.

To handle designs with non-uniform wire widths and spacings, gridless routing is needed due to its higher flexibility. In this invention, a unified RDL routing framework based on the modulus-based matrix splitting iteration method (MMSIM) [please refer to the reference 1: Z.-Z. Bai. Modulus-based matrix splitting iteration methods for linear complementarity problems. Numerical Linear Algebra with Applications, 17:917-933] and bipartite matching is proposed. The MMSIM-based method assigns each wire a rough position while considering multiple design rules, and bipartite matching is applied to further refine those positions. With the unified framework, both grid-based designs (with uniform wire widths and spacings) and gridless designs (variable wire widths and spacings) can be handled while achieving high solution quality in wirelength, as shown in FIG. 2. Wires 104 routed on layers 2/3. In particular, different from other gridless routing algorithms that treat grid-based routing as a special case, which may be an overkill, the proposed unified framework exploits the property of the MMSIM and can solve both designs efficiently and elegantly. Signals (signal nets) are shielded by power/ground nets.

Preliminaries:

Firstly, a new RDL routing problem, corresponding design rules, and the LCP (linear complementarity problem) and the MMSIM are described.

An RDL layout (chips and bumps) and a set of pre-assignment nets are input.

(A) Problem Formulation

The 2.5D IC RDL routing problem addressed in this invention is different from those in previous works. RDL routing is defined to route nets between dice. A new structure and additional issues are considered. Here, some terminologies and notations used throughout this invention are given:

A pre-assignment net is a net with predefined bump assignments.

A track is a horizontal line which can accommodate potential connections on an RDL. If a wire/connection is assigned to a track, this wire will be routed on the line segment of the track between two chips. For a grid-based design, a track is a predefined position on a horizontal layer. For a gridless design, a track is constructed according to the design rules and routing configuration, described in the following MMSIM-based routing.

$T=\{t_1, t_2, \ldots, t_{|T|}\}$ is the set of constructed tracks.

$C=\{c_1, c_2, \ldots, c_{|C|}\}$ is the set of chips mounted on an interposer.

$N=\{n_1, n_2, \ldots, n_m\}$ is the set of pre-assignment nets for all frontside bump pairs, where m is the number of pre-assignment nets and $n_i$ is the i-th connection between two chips. For easier presentation, 2-pin nets are for example, and then extend the proposed algorithm to general structures.

$W^n=\{w_1^n, w_2^n, \ldots, w_m^n\}$ is the set of wire widths, where $w_i^n$ is the given wire width of $n_i$. For grid-based designs, the wire widths are uniform.

$W^g=\{w_1^g, w_2^g, \ldots, w_m^g\}$ is the set of shielding widths. For a pre-assignment net $n_i$, a power/ground net of width $w_i^g$ is required to shield an upper or lower horizontal layer.

$l_g$ is the basic shielding width, where $w_i^g=w_i^n+l_g$.

$l_s$ is the minimum spacing between a wire and a power/ground net on the same layer. $l_s$ is also the minimum spacing between wires in adjacent horizontal layers.

Figure 3:
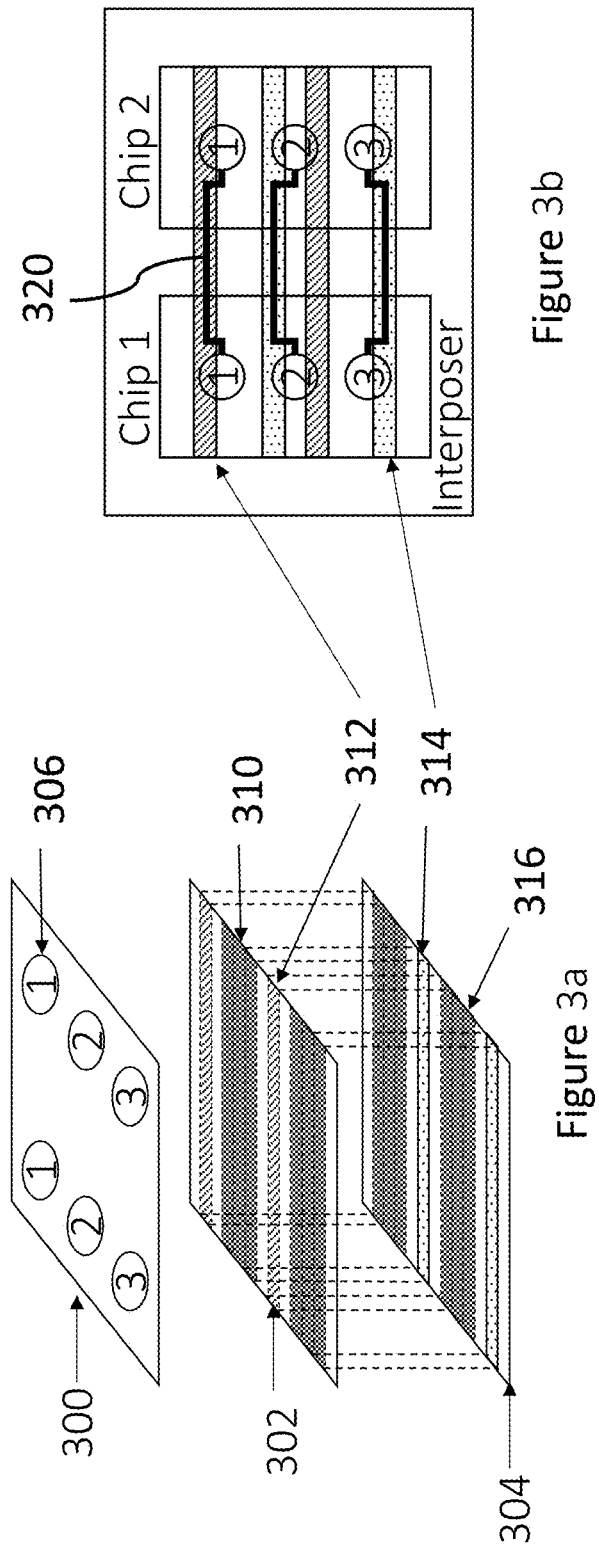

In this invention, the algorithm is proposed by following the industrial structure (ASE Group. http://www.aseglobal.com/en/; eSilicon, Inc, https://www.esilicon.com/) for easier presentation, and then extend the algorithm to more general structures. FIG. 3a shows the structure of the considered RDL routing plane. Different from the previous works, the structure contains two consecutive horizontal layers and one vertical preferred layer. The structure allows wires to be routed on either predefined positions with uniform wire widths, i.e., grid-based routing, or any real-valued positions with variable wire widths and spacings, i.e., gridless routing. The objective is to develop a unified framework to handle both types of designs. As shown in FIG. 3a, the bumps 306 are distributed on a layer 300 (layer 3), vertical wires and partial horizontal wire are routed on the layer 300, and horizontal wires 320 on tracks 312 and 314 on a layer 302 (layer 2) and a layer 304 (layer 1), where power/ground nets 310 and 316 are interleaved with the wires 320, respectively. Power/ground nets are interleaved with the signal nets. Signal nets are shielded by power/ground nets.

FIG. 3b shows the top view of a routing result satisfying all the design rules corresponding to FIG. 3a. Tracks are formed on layer 1/2, wires routed on layer 1/2/3. Here, the problem is formally defined as follows:

The Unified Pre-Assignment Multi-layer Multi-Chip RDL Routing Problem: Given an RDL layout, a netlist of pre-assignment nets N, and design rules, connect all pre-assignment nets $n_i \in N$ such that there is no net crossing and the total wirelength is minimized.

(B) Design Rules

A structure designed for mitigating coupling effects is adopted in this invention. The considered RDL structure is different from those of previous works. Several specific design rules are required to reduce the design complexity and/or fabrication difficulties. The major design rules (routing constraints) of the problem are described as follows:

(i) To reduce coupling effects, wires routed on horizontal layers are interleaved with power/ground nets. A power/ground net of width $w_i^g$ ($w_i^g = w_i^n + 1_g$) is required to shield a pre-assignment net on an upper or lower horizontal layer (ASE Group. http://www.aseglobal.com/en/; eSilicon, Inc, https://www.esilicon.com/).

(ii) To achieve higher density while maintaining shielding, the y distance between any two wires (horizontal tracks) on adjacent layers should be larger (wider) than the minimum spacing $1_s$.

(iii) The distance between any two nets of the same layer should be larger than the minimum spacing $1_s$.

(iv) Wires should be routed in the interposer region.

(C) LCP and MMSIM

The proposed algorithm is based partly on solving the LCP by the MMSIM. The LCP and the MMSIM are described as the following.

Given a real square matrix M and a real vector q, the LCP finds a real vector s which satisfies the following constraints:

$$Ms+q \geq 0, s \geq 0, \text{ and } s^T(Ms+q)=0. \quad (1)$$

The MMSIM is considered the most effective and efficient method for solving LCP. The MMSIM for a given LCP(q, M) is defined as follows: Let M=L−U be a splitting of the matrix M. Given an initial real vector $r^{(0)}$, $r^{(k+1)}$ (for k=0, 1, 2, ...) is computed by solving the following linear system until the iteration sequence $\{s^{(k)}\}_{k=0}^{+\infty}$ is convergent:

$$(L+\Omega)r^{(k+1)}=Ur^{(k)}+(\Omega-M)|r^{(k)}|-\delta q, \quad (2)$$

and set $$s^{(k+1)} = \frac{1}{\delta}(|r^{(k+1)}| + r^{(k+1)}). \quad (3)$$

Here, $\Omega$ is a positive diagonal matrix, and $\delta$ is a positive constant. The optimal solution of LCP(q, M) can be derived with the convergence of the MMSIM, whose convergence conditions are proved in the reference 1; for example, matrices M and L must be positive definite.

In the following, the routing algorithm for a popular industrial 2.5D IC package structure is proposed. An overview of the proposed algorithm is provided, and then describe the methods used in each stage. Finally, the proposed algorithm is extended to more general structures (e.g., with multi-pin nets, general shielding structures, etc.).

Figure 4:
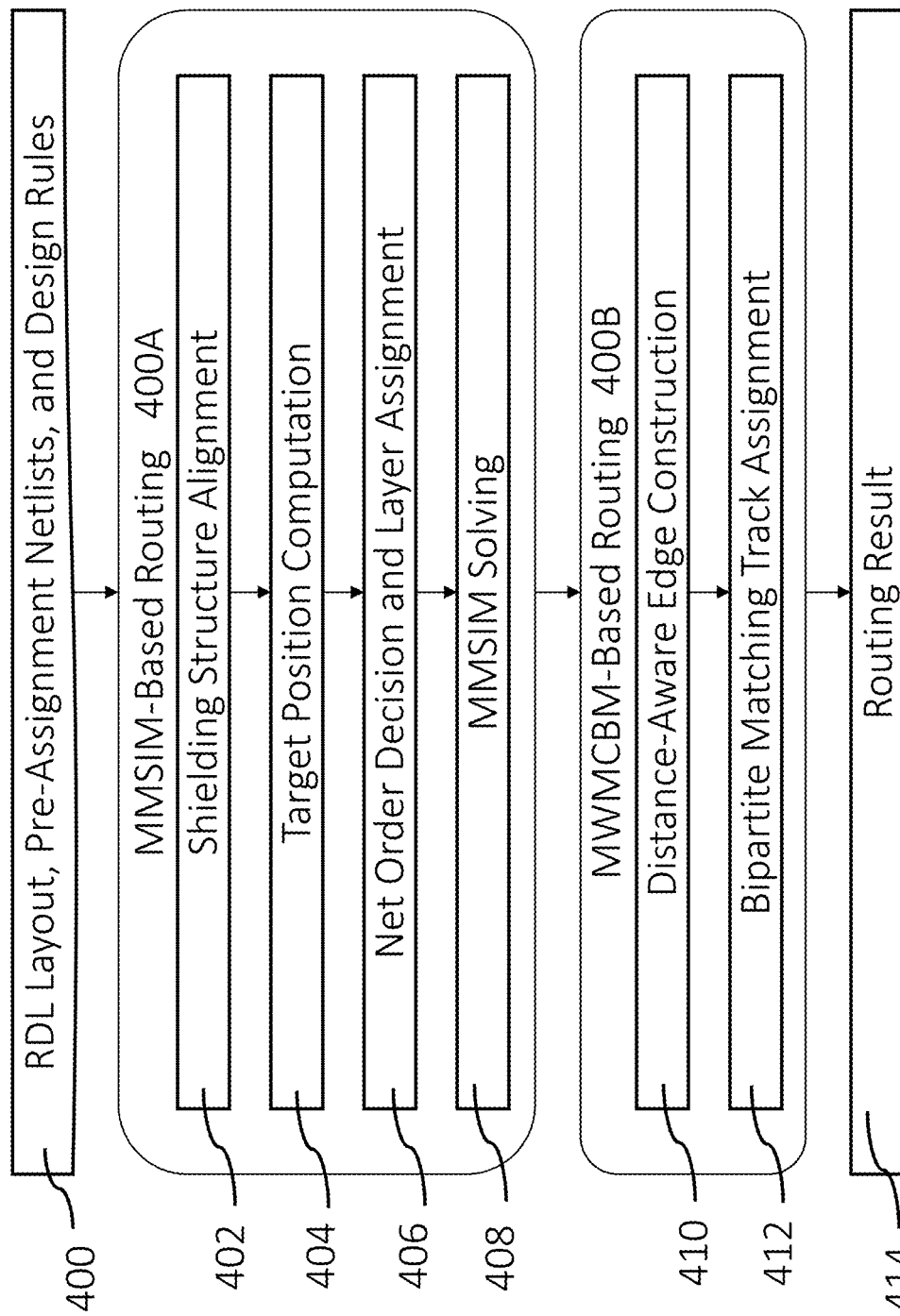
FIG. 4 shows a process flow of the proposed routing algorithm.

As shown in FIG. 4, it illustrates a process flow of a method of a unified RDL routing for 2.5-dimensional integrated circuit packages in accordance with one embodiment of the present invention, which includes the following steps. FIG. 4 summarizes the proposed algorithm of a unified RDL routing for 2.5-dimensional integrated circuit packages, which consists of two major stages: (1) MMSIM-based routing 400A, and (2) minimum weighted maximum cardinality bipartite matching (MWMCBM) based routing 400B.

In step 400, a process technology file is acquired. The process technology file is for example a set of files used within the semiconductor industry to model a fabrication process for the design tools used to design an integrated circuit. The process technology file may include RDL Layout, Pre-Assignment Netlists, and Design Rules.

The Proposed Algorithm

A. Algorithm Overview

First, the routing is relaxed as an LCP and use the MMSIM to solve this converted RDL routing problem. In particular, this MMSIM guarantees to converge to find an optimal solution. After MMSIM-based routing, the problem is reformulated as a MWMCBM one and perform MWMCBM-based routing to refine the solution. With the guidance of the routing result in the LCP/MMSIM stage, MWMCBM-based routing can solve the subproblem sufficiently (efficiently), while preserving an optimal solution. It theoretically proves that an optimal solution of the subproblem is globally optimal for a grid-based design.

As grid-based routing and gridless routing are integrated in a unified framework, it is important not to overdo the problem. With the properties of the MMSIM, the MMSIM-based routing molds the input design type to generate a suitable solution accordingly. That is, for a grid-based design, the MMSIM result is essentially a grid-based solution, and likewise for a gridless one. The MMSIM-based routing finds a result towards a desired solution, leading to a significant edge reduction in the (MWMCBM-based) routing. The optimality of MWMCBM-based routing gives a significant wirelength improvement. As a result, the synergism between MMSIM- and MWMCBM-based routing provides a high-quality solution efficiently for both grid-based and gridless designs.

B. MMSIM-Based Routing

The proposed algorithm of RDL routing for 2.5-dimensional integrated circuit packages include first stage: MMSIM-based routing 400A. MMSIM-based routing 400A includes the following steps. The unified RDL routing problem is first relaxed as a constrained quadratic programming one. Then, the relaxed problem is converted into an LCP and solve it by the MMSIM to obtain a desired solution (e.g., an optimal solution for a gridbased design).

The target of the proposed routing problem is to route nets such that the total routed wirelength is minimized while the design rules are satisfied. For example, it is to use pattern routing with a L-shaped or a Z-shaped route to make a connection. With dense bump distribution, however, it might not be sufficient to apply a single pattern for routing. Consequently, a combination of an L-shaped and a Z-shaped route is applied to make a connection between the horizontal range of each bump pair. For a pre-assignment net $n_i$, the coordinates of two involving bumps are defined as $(x_i^\alpha, y_i^\alpha)$ and $(x_i^\beta, y_i^\beta)$, where a combined pattern route gives the shortest horizontal path length $|x_i^\alpha - x_i^\beta|$ for connecting the bump pair. Therefore, the problem can be converted as assigning pre-assignment nets to tracks such that the total vertical distance from each bump pair to the assigned track is minimized, which can be formulated as follows:

$$\min \sum_{i=1}^{m} |y_i - y_i^\alpha| + |y_i - y_i^\beta| \quad (4)$$

s.t. a) $n_i$ is shielded by a power/ground net of width $w_i^g$, b) net spacing on the same layer $\geq l_s$, c) track spacing on different layers $\geq l_s$, d) wires are routed in the interposer region.

where $y_i$ is the y coordinate of the track to which the pre-assignment net $n_i$ is assigned. Note that doglegs in the considered structure incur bends and lower the routability, so combined patterns without doglegs are applied.

Routing in a 2.5D IC package is a complex process, so obtaining a desired solution directly is time-consuming. Since the objective in the equation (4) is neither smooth nor differentiable, the objective function and the top boundary condition are relaxed to a constrained quadratic programming problem as follows:

$$\min \sum_{i=1}^{m} (y_i - y_i^\alpha)^2 + (y_i - y_i^\beta)^2 \quad (5)$$

s.t. a) $n_i$ is shielded by a power/ground net of width $w_i^g$, b) net spacing on the same layer $\geq l_s$, c) $|y_i - y_j| \geq l_s, \forall i \neq j \in \{1, 2, \ldots, m\}$, d) $y \geq 0$.

In step 402, a shielding structure alignment is performed.

Figure 5:
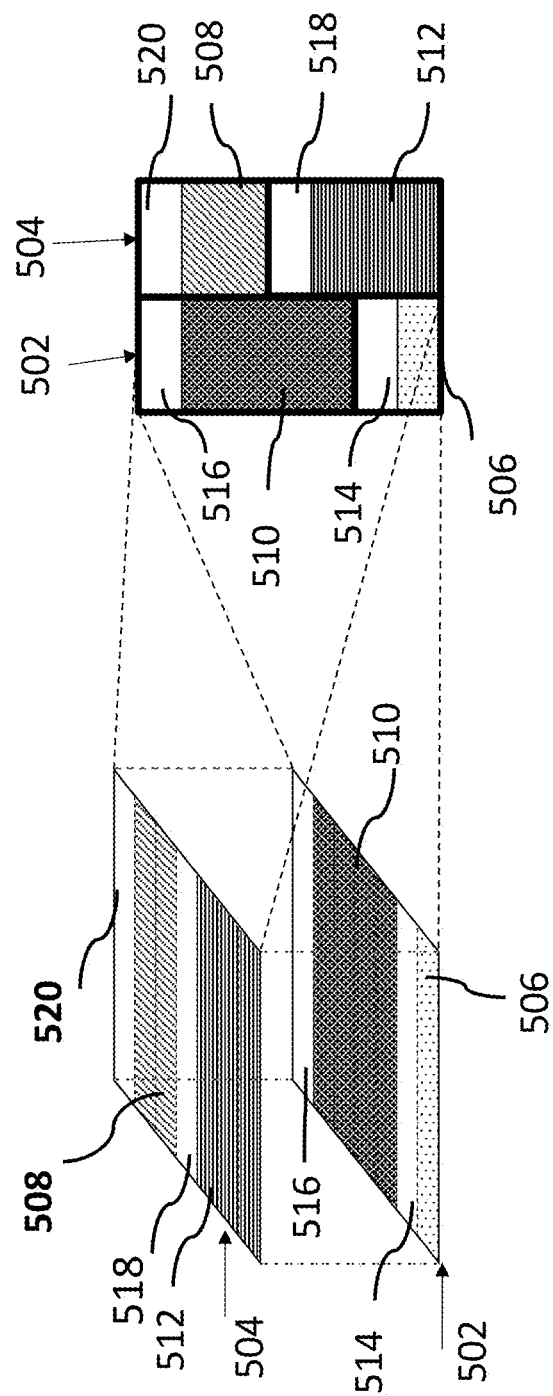

A desired routing structure is shown in FIG. 5a. The horizontal layers 502 and 504 are projected into a column representation (form) shown in FIG. 5b, where tracks 506 and 508, power/ground nets 510 and 512, and spacings 514, 516 and 518, 520 are considered as rectangles in columns, and the width of each instance is transformed into the height of the rectangle in a column.

As the minimum spacing $l_s$ is required between every pair of nets, a net is clustered with a spacing as a block. For each pre-assignment net $n_i$, two blocks are created, a track block $b_i^n$ (for example 506, 508) and a shielding block $b_i^g$ (for example 510, 512). The track block $b_i^n$ is a block clustered by a spacing (for example 514/516, 518/520) and the track for the pre-assignment net $n_i$, and the shielding block $b_i^g$ is a cluster of a spacing and the power/ground net that shields $n_i$ on the upper or lower horizontal layer.

In step 404, a target position computation is performed. The target positions $p_i^n$ and $p_i^g$ for $b_i^n$ and $b_i^g$ are introduced, respectively. The target position $p_i^n$ for a track block $b_i^n$ may be y coordinate of bump pair center. A target position is a desired location of a block such that the objective in the equation (5) is minimized, and the desired structure is formed. A desired structure is shown in FIG. 5b, where the wires are interleaved and aligned with the power/ground nets on corresponding layers. The target position $p_i^n$ for a track block $b_i^n$ is computed by minimizing the objective function in the equation (5), while the target position $p_i^g$ for a shielding block $b_i^g$ by aligning it with the bottom and the top of $b_i^n$ for the pre-assignment net $n_i$ assigned on the two adjacent layers 502 (layer 1) and 504 (layer 2), respectively, as shown in FIG. 6a and FIG. 6b.

Figure 6:
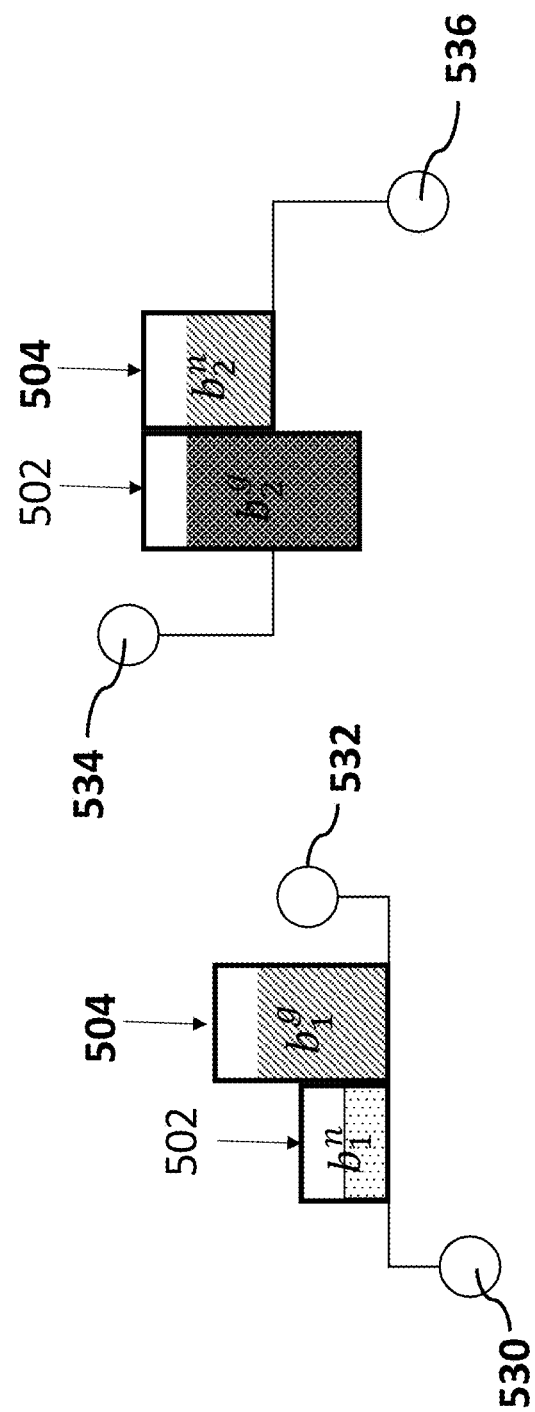
FIGS. 6a to 6b illustrate the pre-assignment nets assigned on layers 1 and 2, respectively.

For the pre-assignment nets assigned on the layer 1 and the layer 2, the shielding blocks are aligned with the bottom and the top of the track blocks, respectively, as shown in FIG. 6a and FIG. 6b.

According to the target position $p_i^g$, it aligns to the bottom of track block for $n_i$ assigned in layer 1, and aligns to the top of track block for $n_i$ assigned in layer 2. In one embodiment, the target position for shielding block aligns to the bottom of track block for $n_i$ assigned in odd number layer, and aligns to the top of track block for $n_i$ assigned in even number layer. In another embodiment, the target position for shielding block aligns to the bottom of track block for $n_i$ assigned in even number layer, and aligns to the top of track block for $n_i$ assigned in odd number layer.

The target positions are summarized by the following equations:

$$p_i^n = \frac{1}{2}(y_i^\alpha + y_i^\beta), \quad (6)$$

$$p_i^g = \begin{cases} p_i^n, & \text{if } n_i \in \text{layer 1,} \\ p_i^n - l_g, & \text{if } n_i \in \text{layer 2,} \end{cases}$$

where $n_i \in$ layer j represents that the pre-assignment net $n_i$ is assigned to a track on layer j.

Figure 7:
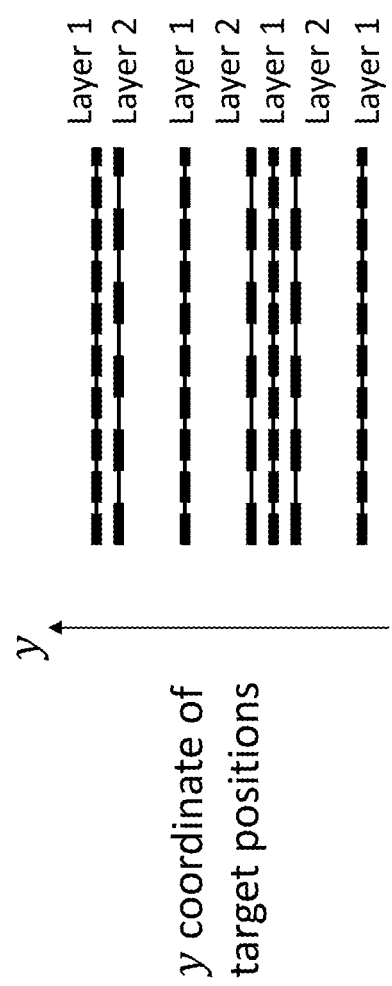
FIG. 7 shows the desired structure formed by assigning layers alternately.

Next, in step 406, a net order decision and layer assignment are performed. The sequence order is defined as the order of pre-assignment nets in nondecreasing y coordinate of the assigned tracks. In order to meet the convergence requirements of the MMSIM, the sequence order of pre-assignment nets has to be fixed. Since a target position $p_i^n$ is representative for bump pair (530/532, 534/536) locations $y_i^\alpha$ and $Y_i^\beta$, the sequence order of pre-assignment nets is set by the target positions. With the defined sequence order, by assigning track blocks to horizontal layers alternately and assigning shielding blocks to the corresponding shielding layer, a desired structure can be obtained, where power/ground nets are interleaved with the tracks, as shown in FIG. 7.

Figure 8B:
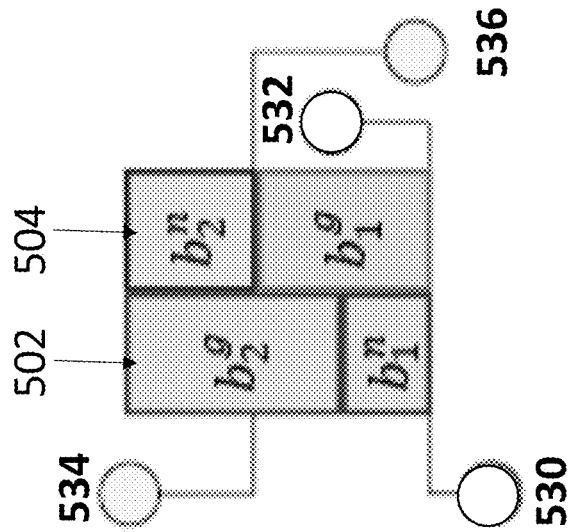
Figure 8A:
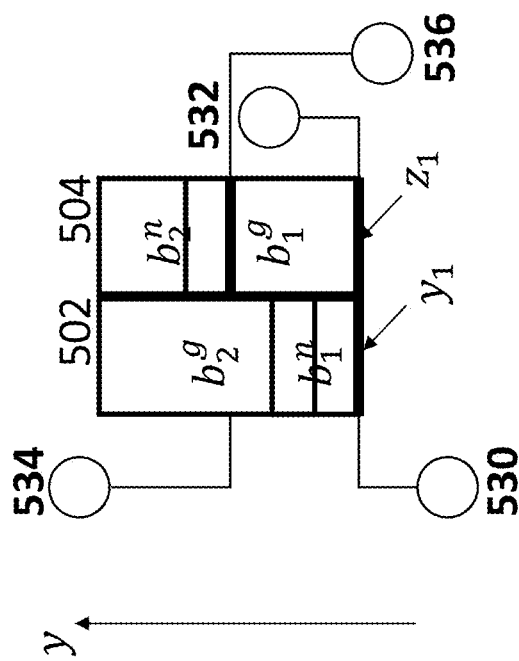
FIG. 8a shows an initial result by combining FIG. 6a and FIG. 6b.

FIG. 8a shows the result after placing blocks to their target positions and corresponding layers. However, the result may contain overlaps between blocks. In the following, in step 408, a MMSIM solving is performed. By reserving sufficient spacing for adjacent blocks in the sequence order to remove the overlaps, a feasible solution can be obtained, as shown in FIG. 8b. Therefore, the equation (5) can be reformulated as follows:

$$\min \sum_{i=1}^{m} (y_i - p_i^n)^2 + \sum_{i=1}^{m} (z_i - p_i^g)^2 \quad (7a)$$

s.t. $z_{i+1} - y_i \geq w_i^n + l_s, \quad \forall i \leq m-1,$ (7b)

$y_{i+1} - z_i \geq w_i^g + l_s, \quad \forall i \leq m-1,$ (7c)

$$z_i = y_i, \quad \forall n_i \in \text{ layer 1,} \tag{7d}$$

$$z_i = y_i - l_g, \quad \forall n_i \in \text{ layer 2,} \tag{7e}$$

$$y \geq 0, z \geq 0, \tag{7f}$$

where $y_i$ and $z_i$ are they coordinates of $b''_i$ and $b^g_i$, respectively.

Constraints (7b) and (7c) are for reserving sufficient spacing for adjacent blocks. The former is for each track block $b''_i$ of width $w''_i + l_s$, and the latter for each shielding block $b^g_i$ of width $w^g_i + l_s$. Constraints (7d) and (7e) are for block alignments. The former aligns shielding blocks with the bottom of track blocks, while the latter aligns with the top. According to the target positions from the equation (6), by aligning blocks with the constraints (7d) and (7e), the second term is identical to the first term in the equation (7a). As a result, the equation (7) is equivalent to the equation (5) with the decided sequence order.

In fact, to satisfy the shielding condition, aligning one layer is sufficient. The spacing satisfies the design rules if one layer is aligned, so the constraint (7e) can be removed. As a result, the equation (7) can be rewritten as follows:

$$\min \frac{1}{2} x^T I x + p^T x \tag{8a}$$

$$\text{s.t.} \quad Hx \geq h, \tag{8b}$$

$$Dx = 0, \tag{8c}$$

$$x \geq 0, \tag{8d}$$

where $$x = \begin{bmatrix} y \\ z \end{bmatrix}, p = \begin{bmatrix} -p^n \\ -p^g \end{bmatrix}.$$

I is an identity matrix, and H, h, and D are defined as follows. H is the constraint matrix for the equations (7b) and (7c), and h is the corresponding vector. Each row in H contains only two nonzero elements 1 and −1 either in $b^g_{i+1}$ and $b''_i$ or in $b''_{i+1}$ and $b^g_i$, which corresponds to the height of $b''_i$ or $b^g_i$ in h. D is the constraint matrix for the equation (7d). Each row also contains only two nonzero elements 1 and −1 in $b^g_i$ and $b''_i$, respectively, for $n_i$ assigned to layer 1. Here gives an example of the matrices for FIG. 8b.

$$H = \begin{bmatrix} -1 & 0 & 0 & 1 \\ 0 & 1 & -1 & 0 \end{bmatrix}, h = \begin{bmatrix} w^n_1 + l_s \\ w^g_1 + l_s \end{bmatrix}, D = [1 \ 0 \ -1 \ 0]$$

To ensure the MMSIM convergence, the constraint matrix is required to be a rectangular matrix of full row rank. Hence, a penalty factor A is introduced for relaxing the constraint (8c) to the objective function of the equation (8a). As long as λ is large enough, the corresponding blocks will be aligned. Then the equation can be reformulated as follows:

$$\min \frac{1}{2} x^T I x + p^T x + \lambda x^T D^T D x \tag{9}$$

$$\text{s.t.} \quad Hx \geq h,$$

$$x \geq 0.$$

Proposition 1

In the equation (9), $I + \lambda D^T D$ is a symmetric positive definite matrix, and H is a rectangular matrix of full row rank.

Proof:

Since I is an identity matrix and $D^T D$ is a positive semidefinite matrix, $I + D^T D$ is apparently symmetric and positive definite. H is a (2m−2)×2m rectangular matrix. In matrix H, since there are only two nonzero elements in each row and at most two nonzero elements in each column, H can be simply transformed to the row echelon form and an identity matrix with 2m−2 pivots in the columns of $b''_i$ and $b^g_i$ for i≤m−1 can be derived. Hence, H in the equation (9) is of full row rank.

Since $I + D^T D$ is a symmetric positive definite matrix, by the Karush-Kuhn-Tucker (KKT) condition (please refer to the reference 2: B. Stephen and L. Vandenberghe. Convex optimization. Cambridge University Press, 2004), x is the optimal solution of the equation (9) if and only if there exist vectors u, σ, and τ satisfying the following KKT conditions:

$$\begin{cases} \sigma = Ix + p + \lambda D^T Dx - H^T u, \\ \tau = Hx - h, \\ \sigma^T x = 0, \\ u^T \tau = 0, \\ x, u, \sigma, \tau \geq 0. \end{cases} \tag{10}$$

The condition (10) can be rewritten as the following LCP (q, M):

$$Ms + q \geq 0, s \geq 0, \text{ and } s^T(Ms + q) = 0, \tag{11}$$

$$\text{where } M = \begin{bmatrix} I + \lambda D^T D & -H^T \\ H & 0 \end{bmatrix}, s = \begin{bmatrix} x \\ u \end{bmatrix}, q = \begin{bmatrix} p \\ -h \end{bmatrix}$$

By the work (please refer to the reference 3: J. Nocedal and S. Wright. Numerical Optimization. New York: Springer, 2006), the optimal solution of the constrained quadratic programming problem (9) gives the solution of the LCP (11), and vice versa. Hence, the solution of the problem (11) by using the MMSIM to solve the LCP of the equation (11) is obtained. The splitting matrix L and U are chosen as the parameterized Uzawa splitting of the saddle point in matrix M (please refer to the reference 4: Z.-Z. Bai, B. N. Parlett, and Z.-Q. Wang. On generalized successive overrelaxation methods for augmented linear systems. Numerische Mathematik, 102(1):1-38, November 2005; the reference 5: Z.-Z. Bai and Z.-Q. Wang. On parameterized inexact Uzawa methods for generalized saddle point problems. Linear Algebra and its Applications, 428(11):2900-2932, 2008) as follows:

$$L = \begin{bmatrix} \frac{1}{\gamma}(I + \lambda D^T D) & 0 \\ H & \frac{1}{\theta} A \end{bmatrix}, \tag{12}$$

-continued $$U = \begin{bmatrix} \left(\frac{1}{\gamma} - 1\right)(I + \lambda D^T D) & H^T \\ 0 & \frac{1}{\theta}A \end{bmatrix},$$

where A=tridiag(H(I+λD$^T$D)$^{-1}$H$^T$) is a tridiagonal approximation to the Schur complement H(I+λD$^T$D)$^{-1}$H$^T$ of the matrix M, and γ and θ are two positive constants determined according to the formulas given in above-mentioned Uzawa methods. As the computation of inverse matrices could be time-consuming, the Sherman07-Morrison formula (please refer to the reference 6: W. H. Press, S. A. Teukolsky, W. T. Vetterling, and B. P. Flannery. Numerical Recipes. Cambridge University Press, 2007) is used to obtain the matrix A. Then, A can be computed by tridiag $$\left(HH^T - \frac{\lambda}{2\lambda + 1}HD^T(HD^T)^T\right).$$

Since matrix I+λD$^T$D is a positive definite matrix and H is a rectangular matrix of full row rank, the convergence of MMSIM can be assured in the reference 6.

Based on the MMSIM for LCP(q, M) in the reference 1, the optimal solution of the equation (9) can be derived by solving the linear system shown in the equations (2) and (3). The MMSIM solver in the reference 7 (J. Chen, Z. Zhu, W. Zhu, and Y.-W. Chang. Toward optimal legalization for mixed-cell-height circuit designs. In Proc. of ACM/IEEE DAC, pages 1-6, June 2017) is applied.

After the solution is derived, some adjustment is made to meet the design rules, e.g. shift tracks within the interposer boundary. For a grid-based design, the positions are mapped to the nearest tracks to obtain a feasible solution. For a gridless design, tracks are constructed to the corresponding positions. Then, a solution y that satisfies all the design rules is derived.

C. MWMCBM-Based Routing

The proposed algorithm of RDL routing for 2.5-dimensional integrated circuit packages include second stage: minimum weighted maximum cardinality bipartite matching (MWMCBM) based routing 400B. After the MMSIM-based routing 400A is completed, the problem is reformulated as a graph matching subproblem and a MWMCBM-based routing is performed to refine the solution. The proposed MWMCBM-based router supports local refinement and obtains an optimal solution for the subproblem. The proposed invention shows that an optimal solution of a subproblem is globally optimal for a grid-based design.

The MWMCBM based routing 400B includes a process of distance-aware edge construction 410 and a process of bipartite matching track assignment. For the step 410, a distance-aware edge is constructed. First, given the set N of pre-assignment nets (nodes to be connected) and the set T of tracks, a bipartite graph G=(V, E) can be constructed, as shown in FIG. 9, where V=N∪T and E is the set of edges connecting $n_i \in N$ and $t_j \in T$ for all $n_i$ and $t_j$ with the same width. The goal is to minimize the objective function as follows:

$$\min \sum_{i=1}^{m} |y_i - y_i^\alpha| + |y_i - y_i^\beta|, \qquad (13)$$

where $y_i$ is they coordinate of the track matched to $n_i$. An edge e($n_i$, $t_j$) exist if the bump pair of pre-assignment net $n_i$ is close enough to the track $t_j$ for all $n_i$ and $t_j$ of the same width. Hence, the cost w of the edge e($n_i$, $t_j$) is set as follows:

$$\psi(e(n_i, t_j)) = \frac{1}{2}(|y_i - y_i^\alpha| + |y_i - y_i^\beta| - |y_i^\alpha - y_i^\beta|), \qquad (14)$$

which implies the distance exceeding they coordinate range between the two involving bumps of $n_i$. The cost ψ of e($n_i$, $t_j$) is the distance that $t_j$ exceeds the y range of the bump pair of $n_i$.

Theorem 1

An optimal solution for the problem (13) is a global optimal solution for a grid-based design.

Proof.

For a grid-based design, the tracks are constructed on all the predefined positions. Since the wire widths of all pre-assignment nets are uniform, G is constructed as a complete bipartite graph with |N||T| edges. Hence, the exact minimum cost for the problem (13) can be derived by applying minimum weighted maximum cardinality bipartite matching (MWMCBM), which is an optimal solution for a grid-based design.

For the step 412, a bipartite matching track assignment is performed. To accelerate the process while satisfying the design rules, pre-assignment nets only match to tracks that are within a limited distance and share the same width. It is known that an optimal solution for the problem (13) can be obtained by applying MWMCBM. However, the number of edges is O(|N||T|), which grows rapidly when the input size increases. As a result, to speed up the process while maintaining the solution quality, pre-assignment nets are connecting to those tracks that are close enough to the solution obtained in MMSIM-Based Routing.

Figure 10:
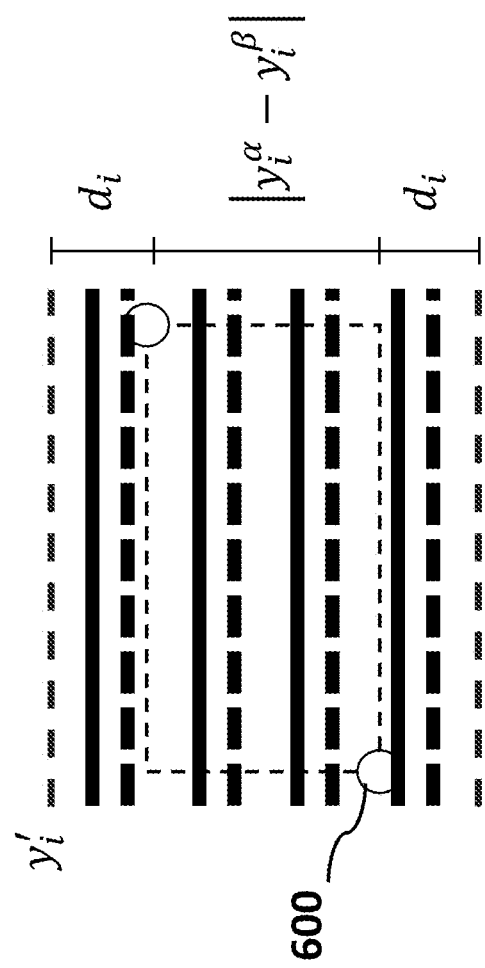
FIG. 10 illustrates a distance-aware edge construction.

According to the equation (14), for each pre-assignment net $n_i$, the excessive distance $d_i$ is introduced as the distance that $y_i$ exceeds the y coordinate range of the bump pair 600, as shown in FIG. 10. An edge between a pre-assignment net and a track is introduced if the track is in the range of the maximum excessive distance. To minimize wirelength, edges between tracks and pre-assignment nets are connected if the tracks are within the range shown in FIG. 10. By uniforming $d_i$, the optimality for the given matching problem (13) can be guaranteed if G has a matching of size N. Hence, the uniform excessive distance d*=max $d_i$ is set. Corresponding to a feasible solution in the previous stage, G has a matching of size |N| by connecting edges within the fixed excessive distance d*, implying that edges are constructed if the edge costs satisfy the following equations:

$$\psi(e(n_i, t_j)) \leq \max_i d_i = d^*, \qquad (15)$$

$$d_i = \frac{1}{2}(|y_i' - y_i^\alpha| + |y_i' - y_i^\beta| - |y_i^\alpha - y_i^\beta|).$$

Note that since an approximate solution is computed in MMSIM-Based Routing, the edge number will be significantly reduced. Finally, according to the matching result, the bumps can be connected to the assigned horizontal tracks from the bump distributed layer by L-shaped routes with shifting and bending if necessary. The bumps are connected to the assigned tracks with L-shaped routes according to the matching result to complete the routing result 414.

Here, the optimality for the problem (13) with edge reduction is then proved. MWMCBM with edge reduction preserve the optimality.

Theorem 2

In the problem (13), if G has a matching of size $|N|$ by connecting edges within a fixed excessive distance $d_*$, an optimal solution can be guaranteed.

Proof.

MWMCBM can be implemented by a minimum cost maximum flow algorithm (please refer to the reference 8: R. K. Ahuja, T. L. Magnanti, and J. B. Orlin. Network Flows: Theory, Algorithms, and Applications. Prentice-Hall, Inc., 1993; and the reference 9: H. W. Kuhn. The hungarian method for the assignment problem. Naval Research Logistics (NRL), 2(1-2):83-97, 1955). By finding the shortest path for $|N|$ iterations, a solution can be derived. For $d^*=0$, an edge for each track between $y^\alpha_i$ and $y^\beta_i$ is built, with a zero edge cost. As $d^*$ increases, the new edges all have the cost $d^*+\varepsilon$, where $\varepsilon$ is a positive variable. If all $n_i \in N$ can be matched within an excessive distance $d^*$, any of the new constructed edges of the cost $d^*+\varepsilon$ will not be chosen by the shortest path. Hence, an optimal solution can be derived if all $n_i \in N$ can be matched within a fixed excessive distance $d^*$.

By the theorems 1 and 2, an optimal solution for a grid-based design can be obtained by the proposed algorithm.

D. Extensions to General Structures

For easier presentation, the invention's algorithm is proposed based on an industrial structure. Here, the proposed algorithm is extending to more general structures.

For a general 2.5D IC package structure as in the reference 10 (Y.-K. Ho and Y.-W. Chang. Multiple chip planning for chip-interposer codesign. In Proc. of ACM/IEEE DAC, pages 1-6, May 2013), inter-chip connections among different chips are connected through I/O buffers. For this structure, the vias in the bump distributed layer can simply replace with I/O buffers.

In the invention, the coupling effects are mitigated by a shielding structure. However, there are many popular alternatives to deal with this issue such as spacing. A coupling violation occurs when the coupling amount of two wires exceeds a threshold $k_{cp}$. As a result, the decoupling spacing can be computed from the following equation:

$$k_{cp} = \frac{\text{overlap wirelength}}{\text{spacing}}. \quad (16)$$

For pre-assignment nets $n_i$ and $n_j$, the decoupling spacing is computed as $l_{ij}$. The proposed algorithm is extended to deal with various spacings by modifying the spacing clustered by track blocks. The shielding blocks can be removed and $l_s$ is can be replaced with the corresponding $l_{ij}$ in the equation (7).

For the structure without consecutive horizontal or vertical layers, the constraints for alignment can be simply removed and the spacing can be revised.

As mentioned earlier, the proposed structure was based mainly on a set of industrial benchmarks which contain only 2-pin nets. In a modern design, however, a circuit might contain multi-pin nets. For each multi-pin net, a desired track position can be computed and bumps connected to the assigned track. Unlike a 2-pin connection, a multi-pin net connects more bumps to the assigned track. In the MMSIM-based routing stage, the objective function in the equation (5) can be modified from two terms to multiple terms, where each term gives the square of the vertical distance from each pin to the assigned track, as shown in the following equation:

$$\min \sum_{i=1}^{m} \sum_{j=1}^{|P_i|} (y_i - y_i^j)^2, \quad (17)$$

where $|P_i|$ is the number of pins in the pre-assignment net $n_i$. The track position can be computed with the corresponding formulations, and the optimality is preserved for the given formulation. In the MWMCBM-based routing stage, the equation (13) can be also modified with multiple terms as follows, $$\min \sum_{i=1}^{m} \sum_{j=1}^{|P_i|} (y_i - y_i^j), \quad (18)$$

where each term is the vertical distance from a pin to the assigned track. The edge cost is the y distance that exceeds the minimum distance for connecting each bump to the assigned track. Without loss of optimality and efficiency, the edge cost can be also computed by the summation of the vertical distance from each pin to the assigned track minus the maximum difference of the y coordinates of bumps, which can be pre-computed. With this extension for multipin nets, an optimal solution can be still obtained for both stages efficiently.

For most industry applications, a 2.5D IC package is composed of a central chip and peripheral ones, and contains only tracks in either the x or y direction. The proposed algorithm readily extends to this type of 2.5D IC packages. However, there are also other types of multiple chip connections. For a 2.5D IC package with multiple chips, more layers will be introduced for vertical connections. As a result, the proposed routing framework can be applied for the x and y directions, one by one. In this invention, it focused on minimizing the vertical distance from each bump pair to its assigned track for the y direction. By applying the proposed framework to the horizontal direction as well, multiple chips can be connected.

In the present invention, the proposed routing algorithm may be implemented in the C++ programming language and LEDA may be used as the proposed graph-based algorithm solver (under the Linux operating system). All the experiments were performed on an Intel Xeon 2.93 GHz Linux workstation with 48 GB memory. The proposed algorithm is compared with the grid-based router presented in the reference 10 and the gridless router presented in the work of Chen et al. (refer to [0006]) based on six industrial benchmarks. Table I lists the statistics of the benchmark circuits. "|C|", "#layers", "#pins", and "|N|" denote the numbers of chips, layers, pins, and pre-assignment nets, respectively.

TABLE I

| Circuits | |C| | # layers | # pins | |N| |
|---|---|---|---|---|
| design1 | 2 | 3 | 173408 | 1726 |
| design2 | 2 | 3 | 116518 | 1748 |
| design3 | 2 | 3 | 252514 | 3304 |
| design4 | 2 | 3 | 573426 | 6944 |
| design5 | 3 | 3 | 715843 | 7664 |
| design6 | 3 | 3 | 1074362 | 12188 |

For grid-based designs, the proposed algorithm is compared with the 2.5D IC package router presented in the reference 10. The algorithm proposed in the reference 10 constructs a complete bipartite graph between bumps and I/O buffers in the same chip. The invention extended the work of the reference 10 by modifying I/O buffers to the constructed tracks to handle our designs. It is known that bipartite matching can obtain an optimal solution of the minimum weight. The second stage of the proposed algorithm also performs bipartite matching. With the guidance of an approximate solution obtained in the first stage, however, the invention can significantly reduce the number of edges while preserving the optimality. The experimental results are shown in Table II which lists comparisons of grid-based RDL routing results, where the routability, the total wirelength, and the runtime are reported. From the results, ours (the proposed) algorithm runs 68× faster than the bipartite matching algorithm alone and obtains optimal solutions for grid-based designs.

TABLE II

| Circuits | Routability (%) | | Total Wirelength (μm) | | Runtime (sec.) | |
|---|---|---|---|---|---|---|
| | Bipartite | Ours | Bipartite | Ours | Bipartite | Ours |
| design1 | 100.0 | 100.0 | 5611732 | 5611732 | 5.17 | 0.20 |
| design2 | 100.0 | 100.0 | 5656492 | 5656492 | 5.88 | 0.21 |
| design3 | 100.0 | 100.0 | 10690142 | 10690142 | 27.09 | 0.57 |
| design4 | 100.0 | 100.0 | 22470260 | 22470260 | 120.19 | 1.80 |
| design5 | 100.0 | 100.0 | 24795361 | 24795361 | 145.13 | 2.13 |
| design6 | 100.0 | 100.0 | 39439739 | 39439739 | 358.54 | 4.80 |
| Comp. | 1.00 | 1.00 | 1.000 | 1.000 | 68.18 | 1.00 |

For gridless designs, the invention also performed experiments on the benchmark circuits listed in Table I. The invention modified the original circuits of uniform wire widths to generate a set of circuits of non-uniform wire widths by using the design rules from industry, where 20% pre-assignment nets were widened to 150%, 200%, or 250% the original widths.

The proposed algorithm is compared with a multilevel gridless routing algorithm, namely VMGR proposed by Chen et al. VMGR first partitions a chip into an array of rectangular subregions, and then routes each net by the evaluated channel density for its uncoarsening and coarsening stages. VMGR performs pattern routing during uncoarsening and maze routing for the failed connections during coarsening. In order to handle the proposed designs, the work of Chen et al. is extended by modifying the rectangular subregions to avoid doglegs in the inter-chip area. Also, to enhance the routability of VMGR, the invention added a combined pattern of an L and a Z-shaped route to the pattern routing during uncoarsening. The experimental results are shown in Table III which list comparisons of gridless RDL routing results, where "N/A" represents incomplete routing results. From the results, the proposed algorithm outperforms VMGR in routability, wirelength, and runtime. The experimental results reveal the effectiveness of the proposed routing framework for both grid-based and gridless designs of 2.5D IC packages.

TABLE III

| Circuits | Routability (%) | | Total Wirelength (μm) | | Runtime (sec.) | |
|---|---|---|---|---|---|---|
| | VMGR | Ours | VMGR | Ours | VMGR | Ours |
| gl_design1 | 100.0 | 100.0 | 5609250 | 5607762 | 12.28 | 0.27 |
| gl_design2 | 100.0 | 100.0 | 5655958 | 5649798 | 13.16 | 0.24 |
| gl_design3 | 100.0 | 100.0 | 10704690 | 10677131 | 56.38 | 0.61 |
| gl_design4 | 100.0 | 100.0 | 22479864 | 22442314 | 278.16 | 1.90 |
| gl_design5 | 94.5 | 100.0 | N/A | 24780221 | 671.07 | 2.24 |
| gl_design6 | 89.8 | 100.0 | N/A | 39414675 | 1782.77 | 4.98 |
| Comp. | 0.97 | 1.00 | 1.002 | 1.000 | 274.79 | 1.00 |

The main contributions, advantages and features of this invention are summarized as follows:

(a) The invention proposes a general 2.5D IC package routing framework which can be applied to both gridless and grid-based routing problems. To the best of our knowledge, this is the first package router that solves both the problems in a unified framework which does not rely on the complex data structure of gridless routing to handle simpler gridbased problems.

(b) The invention is the first disclosure to formulate a routing problem as a linear complementarity problem (LCP) and use the MMSIM to solve this converted problem for RDL routing. By converting a routing problem on RDLs to an LCP, the proposed algorithm can route inter-chip nets with variable widths and spacings while minimizing wirelength.

(c) The invention presents a bipartite matching method, which honors the rough positions computed by the MMSIM, to assign wires to predefined positions. The invention does theoretically prove the optimality of this method for grid-based designs and empirically validate it by comparing our results with the bipartite matching method presented in the reference 10 which obtains the optimal wirelength for their designs.

(d) Experimental results show that the proposed algorithm (approaches) is effective and efficient. Compared with the previous method based on grid-based benchmarks, the proposed routing framework achieves a 68× speedup while maintaining 100% routability and the optimal wirelength. For gridless benchmarks, the proposed framework achieves 100% routability with a 274× speedup, while the previous method cannot.

(e) The proposed framework is general and readily extends to other routing problems.

As will be understood by persons skilled in the art, the foregoing preferred embodiment of the present invention illustrates the present invention rather than limiting the present invention. Having described the invention in connection with a preferred embodiment, modifications will be suggested to those skilled in the art. Thus, the invention is not to be limited to this embodiment, but rather the invention is intended to cover various modifications and similar arrangements included within the spirit and scope of the appended claims, the scope of which should be accorded the broadest interpretation, thereby encompassing all such modifications and similar structures. While the preferred embodiment of the invention has been illustrated and described, it will be appreciated that various changes can be made without departing from the spirit and scope of the invention.

What is claimed is:

1. A non-transitory computer-readable medium containing instructions, which when read and executed by a computer, cause the computer to execute a method of redistribution layer routing for 2.5-dimensional integrated circuits package having a first layer with multiple chips, a second layer with an interposer and a third layer with a substrate, wherein said first layer is configured on said second layer and said second layer is configured on said third layer, wherein the method comprises steps of:

performing a MMSIM (modulus-based matrix splitting iteration method) based routing to assign pre-assignment nets on said first layer to tracks on said second layer and said third layer such that total vertical distance from each bump pair of said pre-assignment nets to said assigned track is minimized; and performing a MWMCBM (minimum weighted maximum cardinality bipartite matching) based routing for bumps such that said bumps are connected to said assigned tracks and said pre-assignment nets are routed on redistribution layers (RDLs) according to matching result of said MWMCBM to complete redistribution layer routing for said 2.5-dimensional integrated circuits package.

2. The non-transitory computer-readable medium of claim 1, further comprising acquiring a process technology file.

3. The non-transitory computer-readable medium of claim 2, wherein said process technology file comprises redistribution layer (RDL) layout, pre-assignment netlists, and design rules.

4. The non-transitory computer-readable medium of claim 3, wherein said design rules comprises: each said pre-assignment nets shielded by a power/ground net;

spacings of said tracks on adjacent layers larger than minimum spacing between a track and a power/ground net on an identical layer;

spacings of said pre-assignment nets on said identical layer larger than said minimum spacing between a track and a power/ground net on said identical layer; and said tracks routed in an interposer region.

5. The non-transitory computer-readable medium of claim 1, wherein said MMSIM based routing includes a process of performing a shielding structure alignment.

6. The non-transitory computer-readable medium of claim 5, wherein said MMSIM based routing further includes a process of computing target position for track block and shielding block.

7. The non-transitory computer-readable medium of claim 6, wherein said MMSIM based routing further includes a process of performing a net order decision of said pre-assignment nets and layer assignment.

8. The non-transitory computer-readable medium of claim 6, wherein said target position for shielding block aligns to a bottom of track block in odd number layer and aligns to a top of track block in even number layer.

9. The non-transitory computer-readable medium of claim 1, wherein said MWMCBM based routing includes a process of distance-aware edge construction.

10. The non-transitory computer-readable medium of claim 9, wherein said MWMCBM based routing further includes a process of a bipartite matching track assignment.

11. A method of redistribution layer routing for 2.5-dimensional integrated circuits package having a first layer with multiple chips, a second layer with an interposer and a third layer with a substrate, wherein said first layer is configured on said second layer and said second layer is configured on said third layer, which is executed by a computer, the method comprising:

using the computer to perform the following:

performing a MMSIM (modulus-based matrix splitting iteration method) based routing to assign pre-assignment nets on said first layer to tracks on said second layer and said third layer such that total vertical distance from each bump pair of said pre-assignment nets to said assigned track is minimized; and performing a MWMCBM (minimum weighted maximum cardinality bipartite matching) based routing for bumps such that said bumps are connected to said assigned tracks and said pre-assignment nets are routed on redistribution layers (RDLs) according to matching result of said MWMCBM to complete redistribution layer routing for said 2.5-dimensional integrated circuits package.

12. The method of claim 11, further comprising acquiring a process technology file.

13. The method of claim 12, wherein said process technology file comprises redistribution layer (RDL) layout, pre-assignment netlists, and design rules.

14. The method of claim 13, wherein said design rules comprises: each said pre-assignment nets shielded by a power/ground net;

spacings of said tracks on adjacent layers larger than minimum spacing between a track and a power/ground net on an identical layer;

spacings of said pre-assignment nets on said identical layer larger than said minimum spacing between a track and a power/ground net on said identical layer; and said tracks routed in an interposer region.

15. The method of claim 11, wherein said MMSIM based routing includes a process of performing a shielding structure alignment.

16. The method of claim 15, wherein said MMSIM based routing further includes a process of computing target position for track block and shielding block.

17. The method of claim 16, wherein said MMSIM based routing further includes a process of performing a net order decision of said pre-assignment nets and layer assignment.

18. The method of claim 16, wherein said target position for shielding block aligns to a bottom of track block in even number layer and aligns to a top of track block in odd number layer.

19. The method of claim 11, wherein said MWMCBM based routing includes a process of distance-aware edge construction.

20. The method of claim 19, wherein said MWMCBM based routing further includes a process of a bipartite matching track assignment.

\* \* \* \* \*